(12) United States Patent
Chou et al.

(10) Patent No.: US 7,125,803 B2
(45) Date of Patent: Oct. 24, 2006

(54) REVERSE TONE MASK METHOD FOR POST-CMP ELIMINATION OF COPPER OVERBURDEN

(75) Inventors: You-Hua Chou, Taipei (TW); Liang-Lun Lee, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 175 days.

(21) Appl. No.: 10/835,418

(22) Filed: Apr. 28, 2004

(65) Prior Publication Data

US 2005/0245077 A1    Nov. 3, 2005

(51) Int. Cl.
*H01L 21/302*    (2006.01)

(52) U.S. Cl. .............. 438/692; 438/690; 257/E21.215

(58) Field of Classification Search .......... 438/690, 438/692; 257/E21.215
See application file for complete search history.

(56) References Cited

U.S. PATENT DOCUMENTS

2004/0248408 A1* 12/2004 Lohokare et al. .......... 438/647
2005/0106848 A1*  5/2005 Bailey et al. ............... 438/597

* cited by examiner

*Primary Examiner*—Bradley K. Smith
(74) *Attorney, Agent, or Firm*—Tung & Associates

(57) ABSTRACT

A novel reverse-tone mask method which is capable of eliminating metal overburden humps in a metal layer electroplated onto a substrate, is disclosed. Typically, the method includes providing a masking layer on a metal layer such as copper previously electroplated onto a substrate; depositing a photoresist layer on the masking layer; patterning the photoresist layer according to the size and location of the largest metal overburden humps in the metal layer; exposing the overburden humps by etching the masking layer according to the patterned photoresist layer; stripping the photoresist layer from the masking layer; subjecting the metal overburden humps to a first CMP or reverse electroplating process; removing the masking layer from the metal layer; and subjecting the metal layer to a second CMP or reverse electroplating process.

15 Claims, 3 Drawing Sheets

REVERSE TONE MASK METHOD FOR POST-CMP ELIMINATION OF COPPER OVERBURDEN

FIELD OF THE INVENTION

The present invention relates to electrochemical plating (ECP) processes used to deposit metal layers on semiconductor wafer substrates in the fabrication of semiconductor integrated circuits. More particularly, the present invention relates to a reverse tone method for reducing overburden after the electrochemical plating of a metal, particularly copper, on a substrate as processing like Dual or Single Damascene processes.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers. Besides, single or dual damascene processes are applied to more advanced semiconductor manufacturing technologies. Since Copper is quite difficult to be removed by dry etching method, Cu CMP application is more suitable for both extra Cu removed and further planarization in damascene process.

Deposition of non-conductive layers on the wafer substrate can be carried out using any of a variety of techniques. These include oxidation, LPCVD (low-pressure chemical vapor deposition), APCVD (atmospheric-pressure chemical vapor deposition), and PECVD (plasma-enhanced chemical vapor deposition). In general, chemical vapor deposition involves reacting vapor-phase chemicals that contain the required deposition constituents with each other to form a nonvolatile film on the wafer substrate. Chemical vapor deposition is the most widely-used method of depositing films on wafer substrates in the fabrication of integrated circuits on the substrates.

Due to the ever-decreasing size of semiconductor components and the ever-increasing density of integrated circuits on a wafer, the complexity of interconnecting the components in the circuits requires that the fabrication processes used to define the metal conductor line interconnect patterns be subjected to precise dimensional control. Advances in lithography and masking techniques and dry etching processes, such as RIE (Reactive Ion Etching) and other plasma etching processes, allow production of conducting patterns with widths and spacings in the submicron range. Electrodeposition or electroplating of metals on wafer substrates has recently been identified as a promising technique for depositing conductive layers on the substrates in the manufacture of metal interconnect lines in integrated circuits and flat panel displays. Such electrodeposition processes have been used to achieve deposition of the copper or other metal layer with a smooth, level or uniform top surface. Consequently, much effort is currently focused on the design of electroplating hardware and chemistry to achieve high-quality films or layers which are uniform across the entire surface of the substrates and which are capable of filling or conforming to very small device features. Copper has been found to be particularly advantageous as an electroplating metal.

Electroplated copper provides several advantages over electroplated aluminum when used in integrated circuit (IC) applications. Copper is less electrically resistive than aluminum and is thus capable of higher frequencies of operation. Furthermore, copper is more resistant to electromigration (EM) than is aluminum. This provides an overall enhancement in the reliability of semiconductor devices because circuits which have higher current densities and/or lower resistance to EM have a tendency to develop voids or open circuits in their metallic interconnects. These voids or open circuits may cause device failure or burn-in.

A typical standard or conventional electroplating system for depositing a metal such as copper onto a semiconductor wafer includes a standard electroplating cell having an adjustable current source, a bath container which holds an electrolyte electroplating bath solution (typically acid copper sulfate solution), and a copper anode and a cathode immersed in the electrolyte solution. The cathode is the semiconductor wafer that is to be electroplated with metal. Both the anode and the semiconductor wafer/cathode are connected to the current source by means of suitable wiring. The electroplating bath solution may include an additive for filling of submicron features and leveling the surface of the copper electroplated on the wafer. An electrolyte holding tank may further be connected to the bath container for the addition of extra electrolyte solution to the bath container, as needed.

In operation of the electroplating system, the current source applies a selected voltage potential typically at room temperature between the anode and the cathode/wafer. This potential creates a magnetic field around the anode and the cathode/wafer, which magnetic field affects the distribution of the copper ions in the bath. In a typical copper electroplating application, a voltage potential of about 2 volts may be applied for about 2 minutes, and a current of about 4.5 amps flows between the anode and the cathode/wafer. Consequently, copper is oxidized at the anode as electrons from the copper anode and reduce the ionic copper in the copper sulfate solution bath to form a copper electroplate at the interface between the cathode/wafer and the copper sulfate bath.

The copper oxidation reaction which takes place at the anode is illustrated by the following reaction equation:

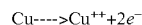

The oxidized copper cation reaction product forms ionic copper sulfate in solution with the sulfate anion in the bath 20:

At the cathode/wafer, the electrons harvested from the anode flowed through the wiring reduce copper cations in solution in the copper sulfate bath to electroplate the reduced copper onto the cathode/wafer:

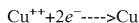

After the copper is electroplated onto the wafer, the wafer is frequently subjected to a CMP (chemical mechanical polishing) process to remove excess copper (copper overburden) from the electroplated copper layer and smooth the surface of the layer to form the metal interconnect lines. Important components used in CMP processes include an automated rotating polishing platen and a wafer holder, which both exert a pressure on the wafer and rotate the wafer independently of the platen. The polishing or removal of surface layers is accomplished by a polishing slurry consisting mainly of colloidal silica suspended in deionixed water or KOH solution. The slurry is frequently fed by an automatic slurry feeding system in order to ensure uniform wetting of the polishing pad and proper delivery and recovery of the slurry. For a high-volume wafer fabrication process, automated wafer loading/unloading and a cassette handler are also included in a CMP apparatus.

In a typical ECP process, an acidic copper or other metal electroplating bath solution typically includes various additives such as suppressors, accelerators and levelers. In order to meet 65-nm technology gap fill requirements, the additive concentrations are selected to achieve rapid bottom-up fill optimization in high aspect ratio vias and trenches, as well as microscopic and macroscopic uniformity. Consequently, excessive post-ECP copper overburden is common, particularly in the fabrication of metal interconnect lines in dense circuit patterns on wafers.

In situations in which metal interconnect lines are densely-packed, defects such as dishing and erosion are often induced in the metal lines as a result of the post-ECP CMP process to remove overburden, particularly with regard to the use of low-k IMDs (intermetal dielectrics). Dishing is an unintended reduction in the thickness of a material toward the center of a feature. Erosion is the excessive thinning of the metal in the high-density patterned area.

One technique which has been used to reduce copper overburden prior to a post-electroplating CMP process includes subjecting the electroplated copper to reverse ECP, in which the substrate is the anode and loses excess metal from the metal overburden humps. However, while this reverse ECP process is capable of lowering the overburden humps prior to CMP, there is always a risk that gapfilling will be reduced through the process. Accordingly, a novel method is needed for the elimination of copper overburden generated during an ECP process, which method is capable of preventing or at least reducing dishing and erosion effects associated with the post-CMP or reverse-ECP treatment of metal interconnect lines in high-density circuit patterns.

An object of the present invention is to provide a novel method which is capable of eliminating copper overburden generated during an ECP process.

Another object of the present invention is to provide a novel reverse tone mask method which is capable of preventing or at least reducing dishing and erosion in an electroplated metal layer during post-ECP chemical mechanical planarization or reverse electrochemical plating.

Still another object of the present invention is to provide a novel reverse tone mask method which includes the use of a masking layer to expose areas of metal overburden, or "overburden humps", in a metal layer electroplated on a substrate to eliminate the metal overburden humps and planarize the metal layer by chemical mechanical planarization or reverse electrochemical plating.

Yet another object of the present invention is to provide a novel reverse tone mask method in which a mask layer is deposited on an electroplated metal as an isolation layer for the selective exposure and removal of metal overburden humps in the metal.

SUMMARY OF THE INVENTION

In accordance with these and other objects and advantages, the present invention generally relates to a novel reverse-tone mask method which is capable of eliminating metal overburden humps in a metal layer electroplated onto a substrate. Typically, the method includes providing a masking layer on a metal layer such as copper previously electroplated onto a substrate; depositing a photoresist layer on the masking layer; patterning the photoresist layer according to the size and location of the largest metal overburden humps in the metal layer; exposing the overburden humps by etching the masking layer according to the patterned photoresist layer; stripping the photoresist layer from the masking layer; subjecting the metal overburden humps to a first CMP or reverse electroplating process; removing the masking layer from the metal layer; and subjecting the metal layer to a second CMP or reverse electroplating process.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel reverse-tone mask method which is suitable for eliminating metal overburden humps remaining in a metal layer after the metal layer is electroplated onto a substrate. The method typically includes providing a masking layer on a metal layer such as copper electroplated onto a substrate, depositing a photoresist layer on the masking layer, patterning and developing the photoresist layer according to the size and location of the large metal overburden humps in the metal layer, exposing the overburden humps through the photoresist layer by etching the masking layer according to the patterned photoresist layer, stripping the photoresist layer from the masking layer, subjecting the large metal overburden humps to a first CMP or reverse ECP process, removing the masking layer from the metal layer, and subjecting the layer to a second CMP or reverse ECP process. The reverse-tone mask method of the present invention is effective in eliminating metal overburden humps from an electroplated metal layer while reducing or eliminating the effects of dishing and erosion commonly associated with conventional post-electroplating CMP or reverse ECP processes.

Figure 1:
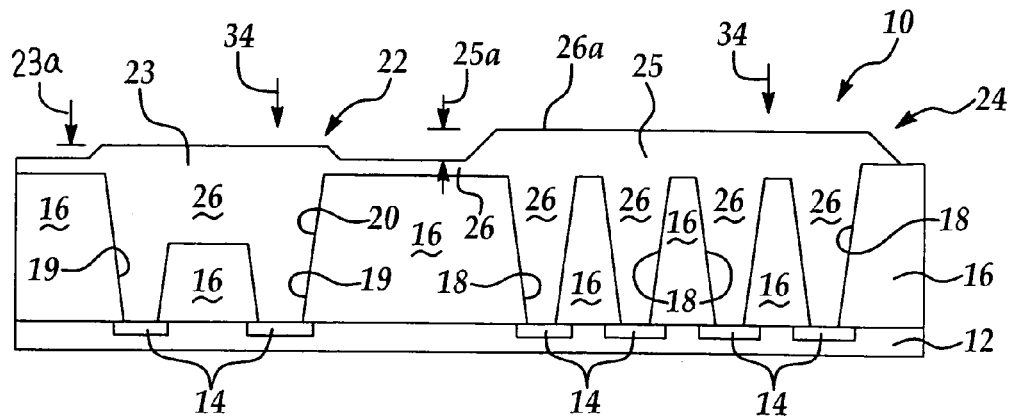
FIG. 1 is a cross-section of a metal layer having a large metal overburden hump and a small metal overburden hump electroplated on a substrate.

Referring initially to FIG. 1, a portion of a partially-fabricated semiconductor device 10 is shown in cross-section for purposes of illustration and not limitation. The semiconductor device 10 includes a semiconductor wafer substrate 12 in which may be provided multiple metal lines 14. At least one dielectric layer 16 is deposited on the substrate 12 and metal lines 14.

The semiconductor device 10 further includes metal interconnect structures 22, 24, respectively. The metal interconnect structure 22 has a pattern density of 0–60%, and the metal interconnect structure 24 has a pattern density of 90%–100%. Usually the pattern density is defined as a formula: (metal line width)/(metal line width+space). The metal interconnect structure 22 includes a trench opening 20 and a pair of underlying via openings 19 which extend through the dielectric layer or layers 16 to a pair of respective metal lines 14. The metal interconnect structure 24 includes multiple, adjacent via openings 18 which extend through the dielectric layer or layers 16 to respective metal lines 14.

A metal layer 26, typically copper, fills the trench opening 20 and via openings 19 of the metal interconnect structure 22 and the via openings 18 of the metal interconnect structure 24. In the completed semiconductor device 10, the metal lines 14 in the substrate 12 provide horizontal electrical conduction pathways between device features in integrated circuits fabricated on the substrate 12. The metal layer 26 in the trench opening 20 and via openings 19 of the structure 22, as well as in the via openings 18 of the structure 24, forms metal lines which provide vertical electrical conduction pathways between device features in the integrated circuits.

In the initial fabrication stages, the metal lines 14 are formed by initially patterning and etching trenches in the substrate 12, typically using conventional photolithographic and etching techniques. This is followed by filling of the metal lines 14 in the trenches with copper or other metal, typically using conventional chemical vapor deposition (CVD) or electrochemical plating (ECP) techniques.

The metal interconnect structures 22, 24 are fabricated typically using a dual damascene technique. While there exist many variations of the dual damascene interconnect fabrication process, the process typically involves deposition of the dielectric layer 16 in multiple stages and etching of the via openings 19 and trench opening 20 of the structure 22, and the via openings 18 of the structure 24, in the dielectric layer 16. In a single metal inlay step, the metal layer 26 is deposited in the via openings 19, trench opening 20 and via openings 18, typically using conventional electrochemical plating (ECP) techniques.

Upon completion of the ECP process, an excess quantity of metal, known in the art as metal overburden, commonly exists on the upper surface of the metal layer 26. The quantity of metal in each metal overburden region on the surface of an electroplated metal layer typically varies across the surface of the layer. While many overburden regions of various sizes or heights may exist in the upper surface of a metal layer electropated on a dielectric layer, two metal overburden regions are shown in FIG. 1 as a small overburden hump 23 on the metal interconnect structure 22 and a large overburden hump 25 on the metal interconnect structure 24, respectively. Typically, the size or height of the metal overburden is proportional to the number of trenches or vias in a metal interconnect structure. Prior to the fabrication of higher-order interconnect structures in the semiconductor device 10, the small overburden hump 23 and the large overburden hump 25 must be removed from the metal layer 26. According to the method of the present invention, the small overburden hump 23 and the large overburden hump 25 are eliminated in such a manner as to prevent or reduce dishing and/or erosion on the metal layer 26 in the metal interconnect structures of the semiconductor device 10.

Referring again to FIG. 1, in a first step according to the method of the present invention, the semiconductor device 10 may be subjected to a nitrogen-charging step in which the upper surface 26a of the metal layer 26 is exposed to molecular nitrogen/inert gas 34. The nitrogen/inert gas 34, which is charged into the FOUP or the wafer container, prevents oxidation of the metal layer 26 during the subsequent overburden elimination steps.

Figure 2:
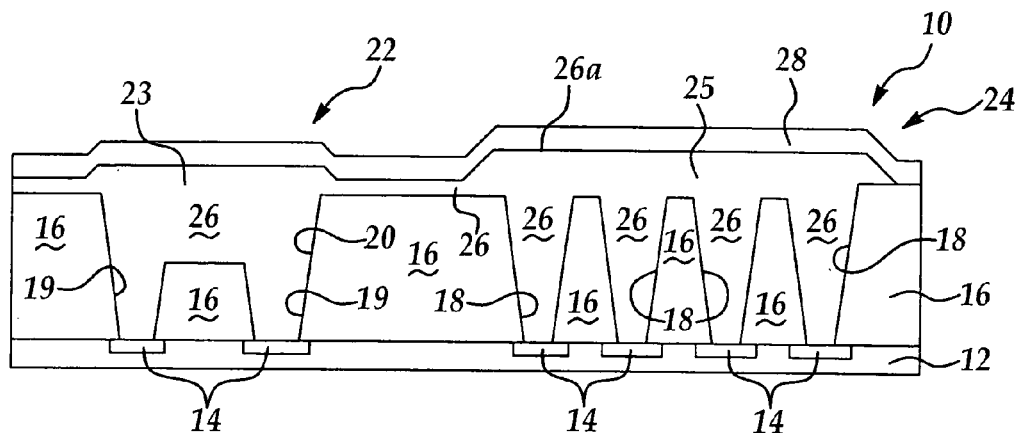
FIG. 2 is a cross-section of the metal layer, with a masking layer deposited on the metal layer.

Referring next to FIG. 2, a masking layer 28 is blanket-deposited on the upper surface 26a of the metal layer 26. In subsequent chemical mechanical planarization (CMP) or reverse electrochemical plating (ECP) processing steps, the masking layer 28 serves as an isolation layer to isolate most of the metal layer 26 from the CMP or reverse ECP process while exposing the large overburden hump 25 to the process. The masking layer 28 is typically SiC or SiON and may be deposited on the upper surface 26a of the metal layer 26 using conventional chemical vapor deposition (CVD) techniques, according to the knowledge of those skilled in the art. Preferably, the masking layer 28 has a thickness of typically about 100 Å to 2000 Å, which is defined by both Cu overburden thickness and Cu CMP slurry chemical selectivity.

Figure 3:
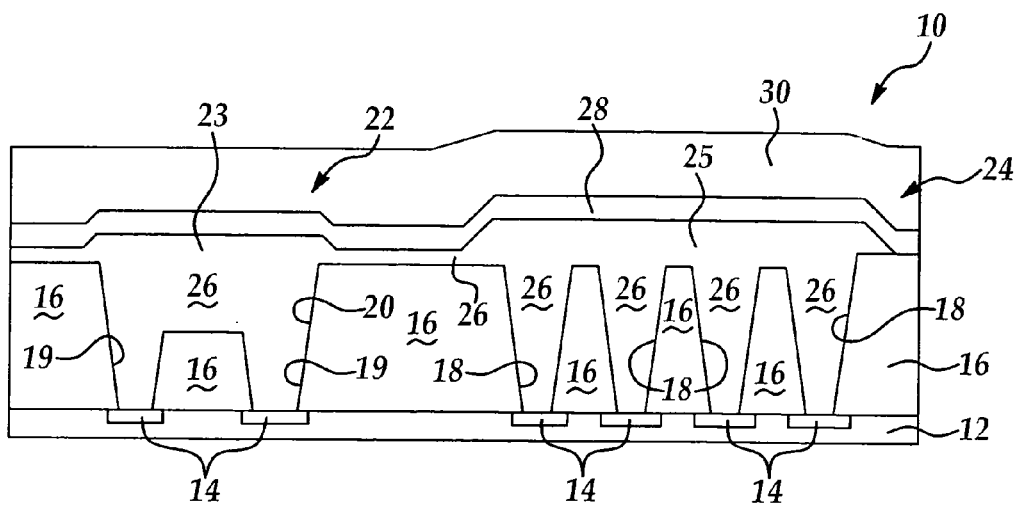
FIG. 3 is a cross-section of the metal layer, with a photoresist layer deposited on the masking layer.

Referring next to FIG. 3, a photoresist layer 30 is next blanket-deposited on the masking layer 28. The photoresist layer 30 covers the entire masking layer 28, including the portions of the masking layer 28 which cover the small overburden hump 23 and the large overburden hump 25. The photoresist layer 30 is deposited on the masking layer 28 typically using conventional photoresist spin-coating techniques which are well known by those skilled in the art.

Figure 4:
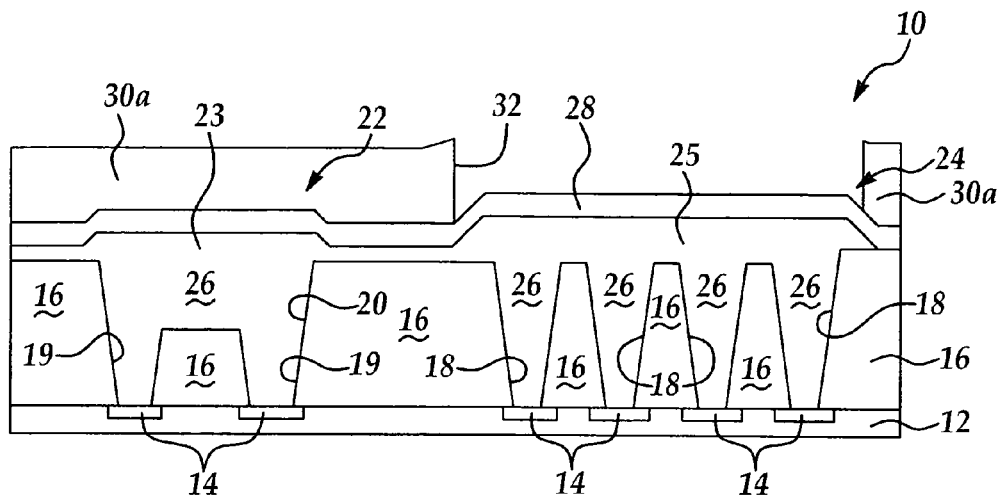
FIG. 4 is a cross-section of the metal layer, with the photoresist layer patterned to expose the portion of the masking layer which covers the large overburden hump on the metal layer.

Referring next to FIG. 4, the photoresist layer 30 of FIG. 3 is next patterned and developed to form a photoresist mask 30a having mask openings 32 (one of which is shown in FIG. 4), the size and location of which correspond to the large overburden humps 25 in the metal layer 26. Accordingly, the portion of the masking layer 28 that overlies each of the largest overburden humps 25 in the metal layer 26 is exposed through a mask opening 32 of a size which corresponds to the size of each large overburden hump 25. The portion of the masking layer 28 that overlies each of the smaller overburden humps 23 in the metal layer 26 remains covered by the photoresist mask 30a. For purposes of the invention, the large overburden hump 25 has a hump height 25a which is at least about 20% larger than the hump height 23a of the small overburden hump 23.

Figure 5:
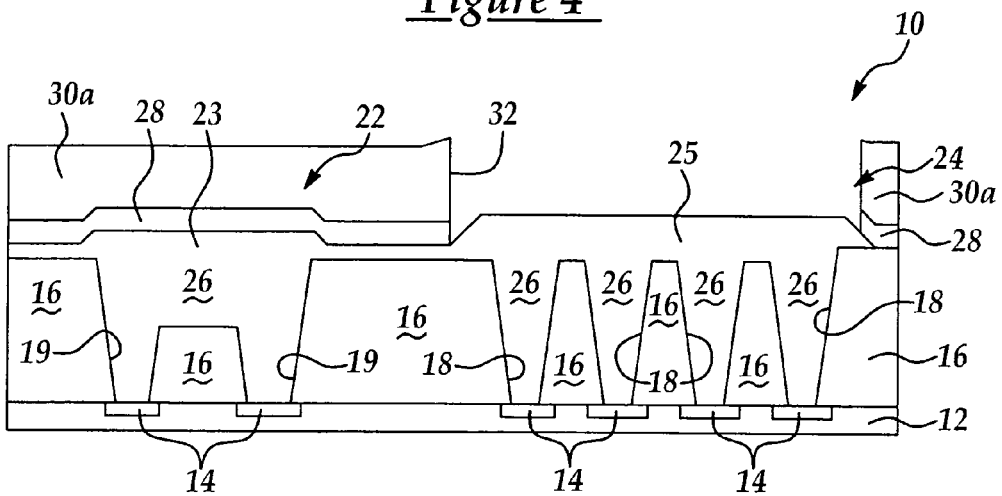
FIG. 5 is a cross-section illustrating etching of the masking layer according to the patterned photoresist to expose the large overburden hump.

Referring next to FIG. 5, the portion of the masking layer 28 which overlies the large overburden hump 25, as shown in FIG. 4, is next etched away from the metal layer 26, according to the pattern of the mask openings 32 in the photoresist mask 30a. This step may be carried out in a conventional etching system using process parameters which are known by those skilled in the art. Accordingly, the large overburden hump 25 is directly exposed through the mask opening 32, whereas the small overburden hump 23 remains covered by the masking layer 28.

Figure 6:
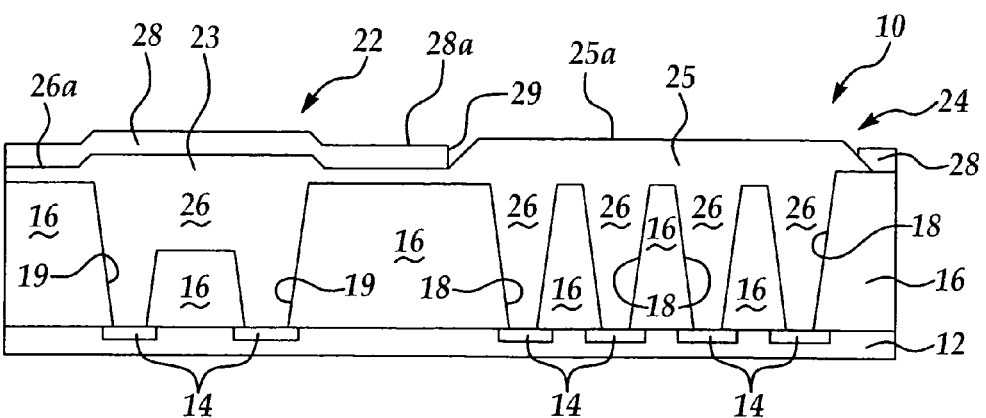
FIG. 6 is a cross-section illustrating stripping of the patterned photoresist layer from the remaining portion of the masking layer.

Referring next to FIG. 6, the photoresist mask 30a is next stripped from the underlying masking layer 28, such as by using a conventional plasma ashing process, for example. The masking layer 28 remains intact on the small overburden hump 23, leaving a mask opening 29 in the masking layer 28 and through which the large overburden hump 25 extends. Accordingly, the upper surface 25a of the large overburden hump 25 extends beyond the upper surface 28a of the masking layer 28.

Figure 7:
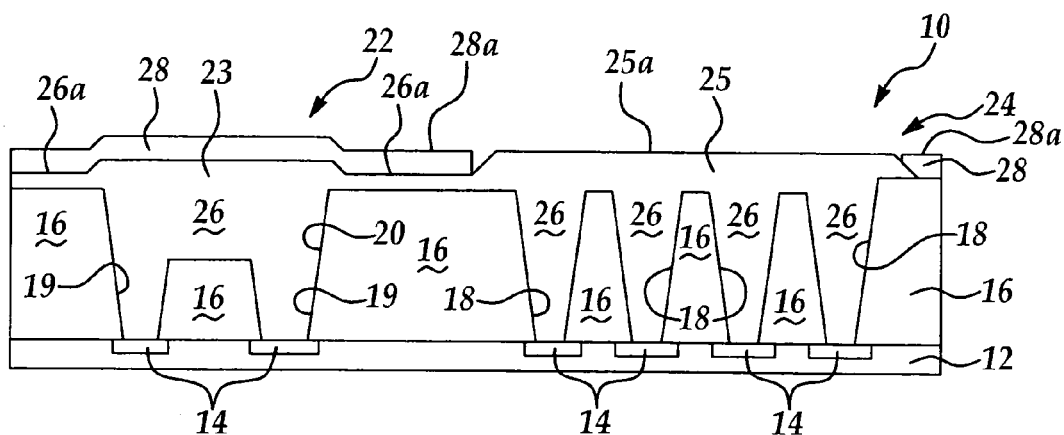
FIG. 7 is a cross-section illustrating elimination of the large overburden hump exposed through the etched masking layer by chemical mechanical planarization (CMP) or reverse electrochemical plating (ECP)

Referring next to FIG. 7, most of the large overburden hump 25 is next eliminated by subjecting the large overburden hump 25 to a first CMP or reverse ECP step. The masking layer 28 shields the remaining portion of the metal layer 26, including the small overburden hump 23, from the CMP or reverse ECP process. Upon conclusion of the CMP or reverse ECP process, the upper surface 25a of the remaining portion of the large overburden hump 25 is substantially coplanar with respect to the upper surface 28a of the masking layer 28.

Figure 8:
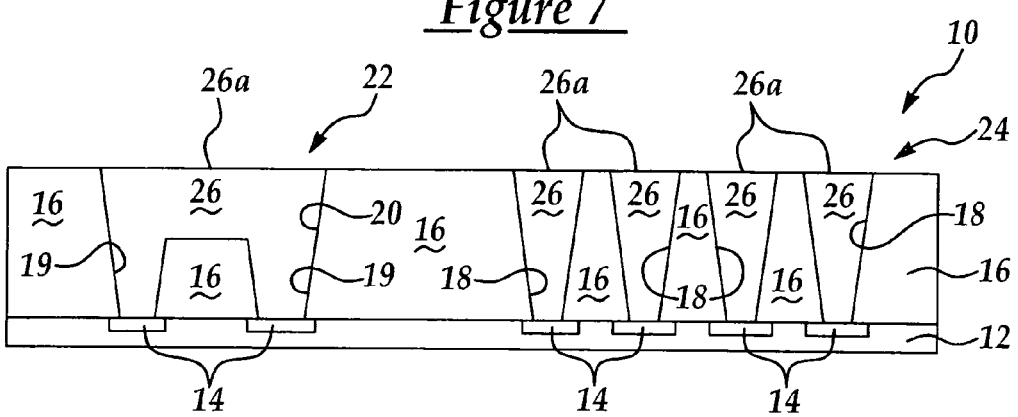
FIG. 8 is a cross-section illustrating removal of the masking layer from the metal layer, followed by elimination of the smaller overburden hump in a second CMP or reverse ECP step.

Referring next to FIG. 8, the masking layer 28 of FIG. 7 is next stripped from the underlying metal layer 26. This step exposes the remaining upper surface 26a of the metal layer 26, including the small overburden hump 23. Then, the small overburden hump 23 and the portion which remains of the large overburden hump 25 are simultaneously subjected to a second CMP or reverse ECP process to eliminate the small overburden hump 23 and remaining portion of the large overburden hump 25. At the end of the second CMP step, the upper surface 26a of the metal layer 26 is substantially flat and planar across the entire surface of the semiconductor device 10. Fabrication of higher-level interconnection structures in the semiconductor device 10 can then proceed.

Figure 9:
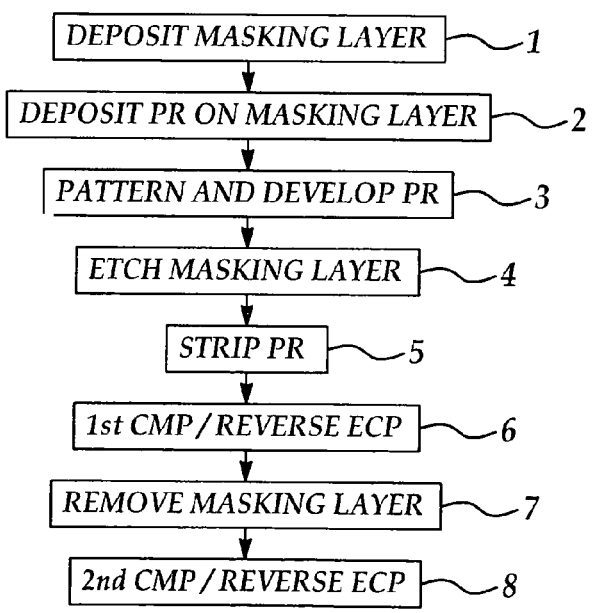
FIG. 9 is a flow diagram illustrating sequential process steps carried out according to the method of the present invention.

Referring next to the flow diagram of FIG. 9, wherein a typical summary of process steps according to the method of the present invention is shown. In process step 1, a masking layer is deposited on the upper surface of an electroplated metal layer. In process step 2, a photoresist layer is deposited on the masking layer. In process step 3, the photoresist layer is patterned and developed to form a photoresist mask having mask openings which correspond in size and location to the large overburden humps on the surface of the electroplated metal layer. In process step 4, the masking layer is etched according to the patterned photoresist mask. In process step 5, the photoresist mask is stripped from the masking layer. In process step 6, the metal layer is subjected to a first CMP or reverse ECP step in which the entire portion of each large overburden hump, or at least the main portion of each large overburden hump, is eliminated. In process step 7, the masking layer is removed or stripped from the metal layer. In process step 8, the metal layer is subjected to a second CMP or reverse ECP process, in which the smaller overburden humps and the remaining portion of the large overburden humps, as necessary, are eliminated from the metal layer to substantially planarize the upper surface of the metal layer without structural defects such as dishing or erosion.

While the preferred embodiments of the invention have been described above, it will be recognized and understood that various modifications can be made in the invention and the appended claims are intended to cover all such modifications which may fall within the spirit and scope of the invention.

What is claimed is:

1. A method of eliminating overburden humps from a metal layer, comprising the steps of:
   charging said metal layer with nitrogen gas or inert gas;
   providing a masking layer overlying the metal layer;
   exposing at least a quantity of said overburden humps through said masking layer;
   removing at least a portion of each of said at least a quantity of said overburden humps through said masking layer;
   removing said masking layer from said metal layer; and
   planarizing said metal layer by completing removal said overburden humps from said metal layer.

2. The method of claim 1 wherein said masking layer is a material selected from the group consisting of SiC and SiON.

3. The method of claim 1 wherein said removing at least a portion of each of said at least a quantity of said overburden humps through said masking layer employs chemical mechanical planarization or reverse electrochemical plating.

4. The method of claim 1 wherein said step of planarizing said metal layer employs chemical mechanical planarization or reverse electrochemical plating.

5. The method of claim 1 wherein said metal layer comprises at least a first overburden hump and at least a second overburden hump, and a hump height of said second overburden hump is larger than a hump height of said first overburden hump.

6. The method of claim 5 wherein said second overburden hump is exposed through said masking layer and then at least a portion of said second overburden hump is removed prior to removing said masking layer.

7. The method of claim 6 wherein said step of planarizing said metal layer removes said first overburden hump and the remaining portion of said second overburden hump.

8. The method of claim 1 wherein said metal layer is a copper layer.

9. A method of eliminating overburden humps from a metal layer, comprising the steps of:
   providing a masking layer overlying the metal layer;
   exposing a quantity of said overburden humps through said masking layer by etching said masking layer;
   removing at least an upper portion of each of said quantity of said overburden humps through said masking layer;
   removing said masking layer from said metal layer; and
   planarizing said metal layer by removing a lower portion of said each of said quantity of overburden humps and removing a remainder of said overburden humps from said metal layer.

10. The method of claim 9 wherein said masking layer is a material selected from the group consisting of SiC and SiON.

11. The method of claim 9 wherein said removing at least an upper portion of each of said quantity of said overburden humps through said masking layer employs chemical mechanical planarization or reverse electrochemical plating.

12. The method of claim 9 wherein said step of planarizing said metal layer employs chemical mechanical planarization or reverse electrochemical plating.

13. The method of claim 9 wherein said metal layer is a copper layer.

14. The method of claim 9 further comprising the step of charging said metal layer with nitrogen gas or inert gas prior to providing said masking layer overlying said metal layer.

15. The method of claim 9, wherein prior to said step of removing at least an upper portion of each of said quantity of said overburden humps through said masking layer, further comprising the steps of:

providing a photoresist layer overlying said masking layer, in which the photoresist layer comprises an opening;

etching said masking layer through said opening of said photoresist layer to expose said at least a quantity of said overburden humps; and removing said phororesist layer.

* * * * *